(12) United States Patent  
Murase et al.

(10) Patent No.: US 9,413,413 B2
(45) Date of Patent: Aug. 9, 2016

(54) HIGH-FREQUENCY MODULE

(71) Applicant: Murata Manufacturing Co., Ltd., Nagaokakyo-shi, Kyoto-fu (JP)

(72) Inventors: Hisanori Murase, Nagaokakyo (JP); Masashi Hayakawa, Nagaokakyo (JP); Takanori Uejima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 62 days.

(21) Appl. No.: 14/221,455

(22) Filed: Mar. 21, 2014

(65) Prior Publication Data

US 2014/0206299 A1    Jul. 24, 2014

Related U.S. Application Data

(63) Continuation of application No. PCT/JP2012/074195, filed on Sep. 21, 2012.

(30) Foreign Application Priority Data

Sep. 26, 2011   (JP) .................................. 2011-208958

(51) Int. Cl.
    *H04B 1/44*        (2006.01)
    *H04B 1/00*        (2006.01)
             (Continued)

(52) U.S. Cl.
    CPC .................. *H04B 1/44* (2013.01); *H04B 1/006* (2013.01); *H04B 1/0064* (2013.01); *H03H 7/466* (2013.01); *H03H 9/725* (2013.01)

(58) Field of Classification Search
    CPC .... H04B 1/0053; H04B 1/0057; H04B 1/006; H01H 1/0036; H01H 9/541; H03H 7/463; H03H 7/466; H03H 7/468; H03H 9/725
    USPC ........... 455/78, 83, 553.1, 275, 280, 338, 339
    See application file for complete search history.

(56) References Cited

U.S. PATENT DOCUMENTS 5,701,603 A    12/1997   Norimatsu
7,328,041 B2 *   2/2008   Tasaka ........................ 455/552.1
(Continued)

FOREIGN PATENT DOCUMENTS

EP        1 220 316 A2    7/2002
JP         7-297749 A    11/1995
(Continued)

OTHER PUBLICATIONS

Official Communication issued in corresponding European Patent Application No. 12835495.8, mailed on May 27, 2015.
(Continued)

*Primary Examiner* — Duc M Nguyen
(74) *Attorney, Agent, or Firm* — Keating & Bennett, LLP

(57) ABSTRACT

A high-frequency module includes a first switch element and a second switch element that are mounted on a multilayer body. The first switch element includes a common terminal and individual terminals. The second switch element includes a common terminal and individual terminals. The individual terminals are connected to any of SAW filters mounted on the multilayer body or low loss filters provided inside the multilayer body. The individual terminals are grounded by being connected to an inner layer ground electrode inside the multilayer body by conductive via holes.

11 Claims, 6 Drawing Sheets

(51) Int. Cl.
*H03H 7/46* (2006.01)
*H03H 9/72* (2006.01)

(56) References Cited

U.S. PATENT DOCUMENTS

| | | | |
|---|---|---|---|
| 8,466,733 B2* | 6/2013 | Uejima et al. | 327/365 |
| 2004/0113713 A1* | 6/2004 | Zipper et al. | 333/103 |
| 2004/0171356 A1* | 9/2004 | Uriu et al. | 455/83 |
| 2005/0077978 A1 | 4/2005 | Kizuki et al. | |
| 2005/0104685 A1* | 5/2005 | Kuroki et al. | 333/133 |
| 2005/0197095 A1* | 9/2005 | Nakamata et al. | 455/403 |
| 2005/0245283 A1* | 11/2005 | Boyle et al. | 455/552.1 |
| 2007/0123175 A1 | 5/2007 | Watanabe et al. | |
| 2009/0003286 A1* | 1/2009 | Korden et al. | 370/335 |
| 2009/0185512 A1 | 7/2009 | Hayakawa | |
| 2011/0110452 A1* | 5/2011 | Fukamachi et al. | 375/267 |
| 2011/0234295 A1* | 9/2011 | Uejima et al. | 327/407 |
| 2011/0237216 A1* | 9/2011 | Yoshikawa et al. | 455/339 |
| 2011/0260806 A1* | 10/2011 | Takeuchi | 333/103 |
| 2012/0242394 A1 | 9/2012 | Murase et al. | |
| 2012/0325537 A1* | 12/2012 | Toyao et al. | 174/260 |
| 2013/0309984 A1* | 11/2013 | Uejima | 455/114.1 |
| 2015/0061406 A1* | 3/2015 | Ono et al. | 307/112 |

FOREIGN PATENT DOCUMENTS

| | | |
|---|---|---|
| JP | 9-107321 A | 4/1997 |
| JP | 2001-313596 A | 11/2001 |
| JP | 2005-117467 A | 4/2005 |
| JP | 2007-208680 A | 8/2007 |
| JP | 2008-301525 A | 12/2008 |
| JP | 2010-212962 A | 9/2010 |
| WO | 2008/013170 A1 | 1/2008 |
| WO | 2010/106977 A1 | 9/2010 |

OTHER PUBLICATIONS

Official Communication issued in corresponding Japanese Patent Application No. 2013-536225, mailed on Feb. 3, 2015.
Official Communication issued in International Patent Application No. PCT/JP2012/074195, mailed on Oct. 23, 2012.

* cited by examiner

US 9,413,413 B2

HIGH-FREQUENCY MODULE

BACKGROUND OF THE INVENTION

1. Field of the Invention

The present invention relates to high-frequency modules that perform switching to transmit and receive a plurality of communication signals with different frequency bands.

2. Description of the Related Art

Currently, mobile wireless terminals have a variety of specifications and need to transmit and receive a plurality of communication signals that use different frequency bands. In the case where a utilized frequency band is wide, a mobile wireless terminal is provided with a first antenna that transmits and receives a communication signal that uses a low-frequency band (for example, a band in the vicinity of 900 MHz) and a second antenna that transmits and receives a communication signal that uses a high-frequency band (for example, a band in the vicinity of 2.0 GHz).

A high-frequency module is described in Japanese Unexamined Patent Application Publication No. 2010-212962 that includes a first switch element having a common terminal that is connected to a first antenna and a second switch element having a common terminal connected to a second antenna.

FIGS. 7A and 7B are block diagrams illustrating the configuration of a high-frequency module 10P of the related art having the same configuration as the high-frequency module of Japanese Unexamined Patent Application Publication No. 2010-212962, where FIG. 7A illustrates a case in which either of a transmission circuit and a reception circuit is connected to a first antenna ANT1 and FIG. 7B illustrates a case in which either of a transmission circuit and a reception circuit is connected to the second antenna ANT2.

The high-frequency module 10P includes a switch module into which a first switch element 21 and a second switch element 22 are integrated. A common terminal Pc1 of the first switch element 21 is connected to a first antenna connection terminal 101 of the high-frequency module 10P. A first individual terminal Pi11 of the first switch element 21 is connected to a transmission signal input terminal 111 of the high-frequency module 10P via a low pass filter 31. A second individual terminal Pi12 of the first switch element 21 is connected to reception signal output terminals 1121 of the high-frequency module 10P via a SAW filter 411. A third individual terminal Pi13 of the first switch element 21 is connected to reception signal output terminals 1122 of the high-frequency module 10P via a SAW filter 412. A fourth individual terminal Pi14 of the first switch element 21 is connected to a terminating terminal 113. The terminating terminal 113 is grounded via an external terminating resistor Rt1.

A common terminal Pc2 of the second switch element 22 is connected to a second antenna connection terminal 102 of the high-frequency module 10P. A first individual terminal Pi21 of the second switch element 22 is connected to a transmission signal input terminal 121 of the high-frequency module 10P via a low pass filter 32. A second individual terminal Pi22 of the second switch element 22 is connected to reception signal output terminals 1221 of the high-frequency module 10P via a SAW filter 421. A third individual terminal Pi23 of the second switch element 22 is connected to reception signal output terminals 1222 of the high-frequency module 10P via a SAW filter 422. A fourth individual terminal Pi24 of the second switch element 22 is connected to a terminating terminal 123. The terminating terminal 123 is grounded via an external terminating resistor Rt2.

In the case where transmission or reception is performed with the first antenna ANT1, the common terminal Pc1 of the first switch element 21 is connected to any of the individual terminals Pi11, Pi12 and Pi13, and the common terminal Pc2 of the second switch element 22 is connected to the individual terminal Pi24, which terminates the common terminal Pc2. Furthermore, in the case where transmission or reception is performed with the second antenna ANT2, the common terminal Pc2 of the second switch element 22 is connected to any of the individual terminals Pi21, Pi22 and Pi23, and the common terminal Pc1 of the first switch element 21 is connected to the individual terminal Pi14, which terminates the common terminal Pc1.

Thus, a necessary amount of isolation is secured for transmission and reception circuits respectively connected to the first and second antennas.

However, in a mobile wireless terminal equipped with the high-frequency module 10P of the related art, the terminating resistors Rt1 and Rt2 have to be specially used and along with an increase in the number of constituent elements there is a corresponding increase in size. In addition, regarding the high-frequency module 10P, the terminating terminals 113 and 123 for allowing connection of the terminating resistors Rt1 and Rt2 need to be formed and therefore the size of the high-frequency module 10P is increased by a corresponding amount.

In addition, if an attempt is made to provide the terminating resistors Rt1 and Rt2 inside the high-frequency module 10P, along with there being a need for an area in which to mount the terminating resistors Rt1 and Rt2, there is also a need for routing electrodes therefor, and in this case as well the number of constituent elements and the size of the high-frequency module 10P are increased.

SUMMARY OF THE INVENTION

Therefore, preferred embodiments of the present invention provide a high-frequency module that ensures that transmission and reception circuits respectively connected to a plurality of antennas are isolated from each other and that is compact.

A high-frequency module according to a preferred embodiment of the present invention includes a plurality of switch elements each including an antenna connection terminal and a plurality of switching connection terminals, and a multilayer body on which the plurality of switch elements are mounted. A filter component mounted on the multilayer body or a filter circuit including an inner layer electrode of the multilayer body is connected to any of the switching connection terminals. Switching connection terminals of the plurality of switch elements that are not connected to the filter component or the filter circuit are directly connected to an inner layer ground electrode provided in the multilayer body.

With this configuration, along with it being possible to reduce the multilayer body in size due to there being no need for a mounting space for terminating resistors and no need for routing electrodes, the number of constituent elements of the high-frequency module is significantly reduced since there is no need to provide terminating resistors and an overall size reduction is achieved.

In addition, it is preferable that the high-frequency module according to a preferred embodiment of the present invention have the following configuration. The plurality of switch elements are mounted on a front surface of the multilayer body. The switching connection terminals that are not connected to the filter component or the filter circuit are connected to the inner layer ground electrode by conductive via holes that extend in a stacking direction of the multilayer body.

With this configuration, a connection distance is shortened by connecting the switching connection terminals, which are not connected to the filter component or the filter circuit, and the inner layer ground electrode to each other with just conductive via holes. Thus, generation of a parasitic inductance by a line connected to the ground is significantly reduced or prevented, and isolation characteristics are improved.

In addition, in the high-frequency module according to a preferred embodiment of the present invention, it is preferable that the inner layer ground electrode, which is directly connected with conductive via holes to switching connection terminals of the switch elements that are not connected to the filter component or the filter circuit, include portions that are electrically isolated from each other and to each of which one of the switch elements is connected.

With this configuration, transmission of a high-frequency signal between the plurality of switch elements via an inner layer ground electrode is prevented. Thus, characteristics of isolation of the switch elements from each other are further improved.

In addition, in the high-frequency module of the present invention, it is preferable that the inner layer ground electrode be provided closer to the front surface side of the multilayer body than an inner layer electrode that realizes the filter circuit.

With this configuration, since the distance between the switch elements and the inner layer ground electrode is short, lines that connect the switching connection terminals that are not connected to the filter component or the filter circuit to the ground are short. Thus, generation of a parasitic inductance are further reduced or prevented, and isolation characteristics are improved.

In addition, in the high-frequency module according to a preferred embodiment of the present invention, the plurality of switch element are preferably mounted on the multilayer body as an integrated switch module.

With this configuration, as a result of integrating the plurality of switch elements, the overall mounting area of the switch elements is significantly reduced. In addition, the number of control terminals is significantly reduced and the number of external connection terminals used for input of a control signal is reduced. Thus, the multilayer body is significantly reduced in size. In this case, despite the distance between the switch elements being reduced, the necessary isolation is secured by using the above-described ground connection configuration.

According to various preferred embodiments of the present invention, a compact high-frequency module in which isolation of transmission and reception circuits connected to a plurality of antennas is secured is realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
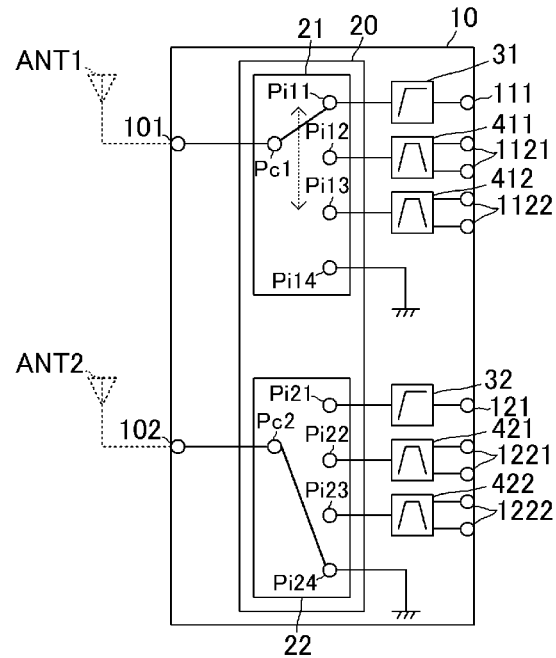
FIGS. 1A and 1B are block diagrams illustrating a circuit configuration of a high-frequency module 10 according to a first preferred embodiment of the present invention.
Figure 1B:
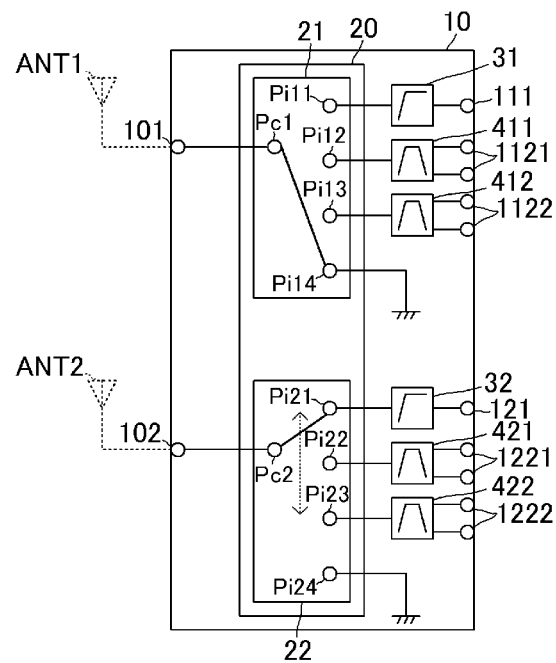

A high-frequency module according to a first preferred embodiment of the present invention will be described while referring to the drawings. FIGS. 1A and 1B are block diagrams illustrating a circuit configuration of a high-frequency module according to the first preferred embodiment of the present invention, where FIG. 1A illustrates a case in which either of a transmission circuit and a reception circuit is connected to a first antenna ANT1 and FIG. 1B illustrates a case in which either of a transmission circuit and a reception circuit is connected to a second antenna ANT2.

The high-frequency module 10 includes a switch module in which a first switch element 21 and a second switch element 22 are integrated.

The first switch element 21 is equipped with a common terminal Pc1 and a plurality of individual terminals Pi11, Pi12, Pi13 and Pi14 (corresponding to "switching connection terminals"). The first switch element 21 switches and connects the common terminal Pc1 to any of the individual terminals Pi11, Pi12, Pi13 and Pi14 on the basis of a control signal.

The common terminal Pc1 of the first switch element 21 is connected to a first antenna connection terminal 101 of the high-frequency module 10. The first antenna connection terminal 101 is connected to the first antenna ANT1. The first antenna ANT1 is an antenna that transmits and receives radio waves of communication signals of a low-frequency band. The term "low-frequency band" refers to, for example, a frequency band in the vicinity of 900 MHz.

The first individual terminal Pi11 of the first switch element 21 is connected to a transmission signal input terminal 111 of the high-frequency module 10 via a low pass filter 31. The transmission signal input terminal 111 is connected to an external transmission signal generator, which is not illustrated. A first low-frequency transmission signal and the second low-frequency transmission signal, which have different frequency bands compared to each other, are input to the transmission signal input terminal 111. The low pass filter 31 is a filter that allows fundamental frequency bands of the first and second low-frequency transmission signals to pass therethrough and attenuates harmonic frequencies of the first and second low-frequency transmission signals, and includes inductors and capacitors including inner layer electrodes provided in a multilayer body 100, which will be described below.

The second individual terminal Pi12 of the first switch element 21 is connected to reception signal output terminals 1121 of the high-frequency module 10 via a SAW filter 411. The reception signal output terminals 1121 are connected to an external first reception signal processor, which is not illustrated. The SAW filter 411 is a filter that allows a fundamental frequency band of a first low-frequency reception signal to pass therethrough and that attenuates other bands. The SAW filter 411 includes a discrete component that is mounted on a front surface of the multilayer body 100.

The third individual terminal Pi13 of the first switch element 21 is connected to reception signal output terminals 1122 of the high-frequency module 10 via a SAW filter 412. The reception signal output terminals 1122 are connected to an external second reception signal processor, which is not illustrated. The SAW filter 412 is a filter that allows a fundamental frequency band of a second low-frequency reception signal to pass therethrough and that attenuates other bands. The SAW filter 412 includes a discrete component that is mounted on the front surface of the multilayer body 100.

The fourth individual terminal Pi14 of the first switch element 21 is directly connected to ground.

The second switch element 22 is equipped with a common terminal Pc2 and a plurality of individual terminals Pi21, Pi22, Pi23 and Pi24 (corresponding to "switching connection terminals"). The second switch element 22 switches and connects the common terminal Pc2 to any of the individual terminals Pi21, Pi22, Pi23 and Pi24 on the basis of a control signal.

The common terminal Pc2 of the second switch element 22 is connected to a second antenna connection terminal 102 of the high-frequency module 10. The second antenna connection terminal 102 is connected to the second antenna ANT2. The second antenna ANT2 is an antenna that transmits and receives radio waves of a communication signal of a high-frequency band. The term "high-frequency band" refers to, for example, a frequency band in the vicinity of 2 GHz.

The first individual terminal Pi21 of the second switch element 22 is connected to a transmission signal input terminal 121 of the high-frequency module 10 via a low pass filter 32. The transmission signal input terminal 121 is connected to an external transmission signal generator, which is not illustrated. A first high-frequency transmission signal and a second high-frequency transmission signal, which have different frequency bands compared to each other, are input to the transmission signal input terminal 121. The low pass filter is a filter that allows fundamental frequency bands of the first and second high-frequency transmission signals to pass therethrough and attenuates harmonic frequencies of the first and second high-frequency transmission signals, and includes inductors and capacitors including inner layer electrodes provided in the multilayer body 100, which will be described below.

The second individual terminal Pi22 of the second switch element 22 is connected to reception signal output terminals 1221 of the high-frequency module 10 via a SAW filter 421. The reception signal output terminals 1221 are connected to an external third reception signal processor, which is not illustrated. The SAW filter 421 is a filter that allows a fundamental frequency band of the first high frequency reception signal to pass therethrough and that attenuates other bands. The SAW filter 421 includes a discrete component that is mounted on the front surface of the multilayer body 100.

The third individual terminal Pi23 of the second switch element 22 is connected to reception signal output terminals 1222 of the high-frequency module 10 via a SAW filter 422. The reception signal output terminals 1222 are connected to an external fourth reception signal processor, which is not illustrated. The SAW filter 422 is a filter that allows a fundamental frequency band of the second high frequency reception signal to pass therethrough and that attenuates other bands. The SAW filter 422 includes a discrete component that is mounted on the front surface of the multilayer body 100.

The fourth individual terminal Pi24 of the second switch element 22 is directly connected to ground.

With the above-described configuration, since there is no need for a mounting space for terminating resistors and no need for routing electrodes as there is in the configuration of the related art, the multilayer body is significantly reduced in size. In addition, since there is no need for terminating resistors, the number of constituent elements of the high frequency module is significantly reduced and an overall reduction in size is achieved.

The high-frequency module 10 having the above-described configuration operates in the following way.

In the case of transmission of the first or second low-frequency transmission signal, the common terminal Pc1 and the first individual terminal Pi11 of the first switch element are connected, and the common terminal Pc2 and the fourth individual terminal Pi24 of the second switch element 22 are connected.

In the case of reception of the first low-frequency reception signal, the common terminal Pc1 and the second individual terminal Pi12 of the first switch element 21 are connected, and the common terminal Pc2 and the fourth individual terminal Pi24 of the second switch element 22 are connected. In the case of reception of the second low-frequency reception signal, the common terminal Pc1 and the third individual terminal Pi13 of the first switch element 21 are connected, and the common terminal Pc2 and the fourth individual terminal Pi24 of the second switch element 22 are connected.

In the case of transmission of the first or second high-frequency transmission signal, the common terminal Pc2 and the first individual terminal Pi21 of the second switch element are connected, and the common terminal Pc1 and the fourth individual terminal Pi14 of the first switch element 21 are connected.

In the case of reception of the first high-frequency reception signal, the common terminal Pc2 and the second individual terminal Pi22 of the second switch element 22 are connected, and the common terminal Pc1 and the fourth individual terminal Pi14 of the first switch element 21 are connected. In the case of reception of the second high-frequency reception signal, the common terminal Pc2 and the third individual terminal Pi23 of the second switch element 22 are connected, and the common terminal Pc1 and the fourth individual terminal Pi14 of the first switch element 21 are connected.

As a result of performing the above-described control, in the case where communication is performed in the low-frequency band, the common terminal Pc2 of the high-frequency-side switch element 22 is directly connected to ground via the fourth individual terminal Pi24. Thus, even if a transmission signal or a reception of the low-frequency band flows into the second switch element 22, it is not reflected but instead flows to ground. In addition, in the case where communication is performed in the high-frequency band, the common terminal Pct of the low-frequency-side switch element 21 is directly connected to ground via the fourth individual terminal Pi14. Thus, even if a transmission signal or a reception signal of the high-frequency band flows into the first switch element 21, it is not reflected but instead flows to ground. Therefore, isolation of the first switch element 21 and the second switch element 22 from each other is secured.

Figure 2:
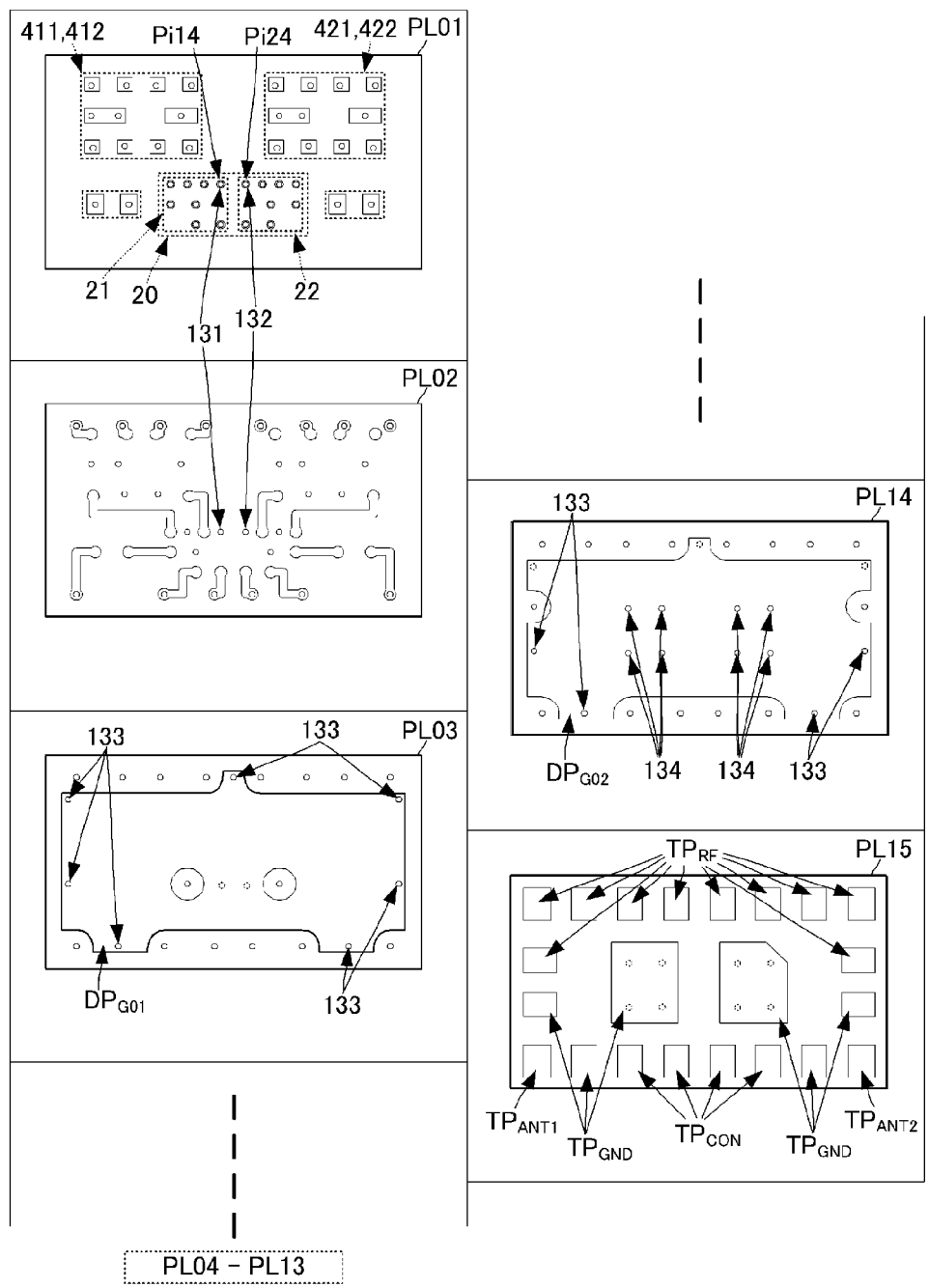
FIG. 2 is a partial layer diagram of the high-frequency module 10 according to the first preferred embodiment of the present invention.
Figure 3:
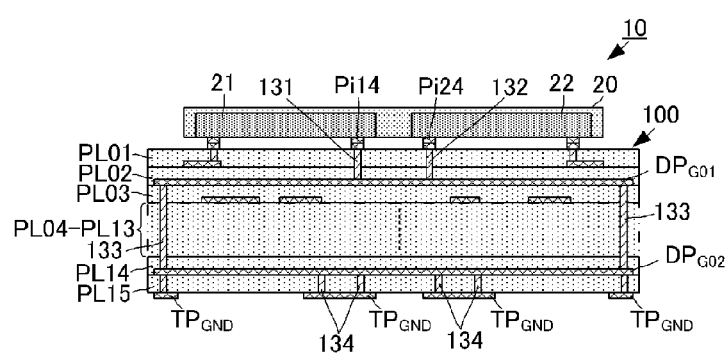
FIG. 3 is a sectional view illustrating a layered structure of the high-frequency module 10 according to the first preferred embodiment of the present invention.

The high-frequency module 10 having the above-described circuit configuration can be realized using the following structure. FIG. 2 is a partial layer diagram of the high-frequency module 10 according to the first preferred embodiment. FIG. 3 is a sectional view illustrating a layered structure of the high-frequency module 10 according to the first preferred embodiment. In FIG. 2 and FIG. 3, illustration of specific structures such as electrode patterns and so forth of layers defining a filter circuit is omitted.

The high-frequency module 10 includes the multilayer body 100, which preferably is formed by stacking a plurality (for example, preferably fifteen in this preferred embodiment) of dielectric layers PL01 to PL15 on top of one another. The dielectric layer PL01 is an uppermost layer of the multilayer body 100 and the dielectric layer PL15 is a lowermost layer of the multilayer body 100.

Mounting lands are provided on a front surface of the dielectric layer PL01, which is a front surface of the multilayer body 100, using predetermined patterns. The switch module 20, into which the first switch element 21 and the second switch element 22 are integrated, is mounted on the front surface of the dielectric layer PL01. A first SAW filter device, into which the SAW filters 411 and 412 are integrated, and a second SAW filter device, into which the SAW filters 421 and 422 are integrated, are mounted on the front surface of the dielectric layer PL01.

Various routing electrodes are provided on the dielectric layer PL02, which is a second layer from the front surface of the multilayer body 100.

An inner layer ground electrode $DP_{G01}$ is arranged over substantially the entire surface of the dielectric layer PL03, which is a third layer from the front surface of the multilayer body 100. The inner layer ground electrode $DP_{G01}$ is connected to the fourth individual terminal Pi14 of the first switch element via a conductive via hole 131 that penetrates through the dielectric layers PL01 and PL02 in the stacking direction. The inner layer ground electrode $DP_{G01}$ is connected to the fourth individual terminal Pi24 of the second switch element 22 via a conductive via hole 132 that penetrates through the dielectric layers PL01 and PL02 in the stacking direction.

Electrode patterns that define inductors and capacitors of the low pass filters 31 and 32 are provided on layers ranging from the dielectric layer PL04 to the dielectric layer PL13, which are respectively the fourth layer and the thirteenth layer from the front surface of the multilayer body 100. The inductors include line-shaped electrodes preferably having a loop-shaped configuration and conductive via holes that connect the line-shaped electrodes to one another in the stacking direction. The capacitors each include a pair of flat plate electrodes of a certain area that face each other with a dielectric layer interposed therebetween.

An inner layer ground electrode $DP_{G02}$ is arranged over substantially the entire surface of the dielectric layer PL14, which preferably is a fourteenth layer from the front surface of the multilayer body 100, for example. The inner layer ground electrode $DP_{G02}$ is connected to the inner layer ground electrode $DP_{G01}$ via a plurality of conductive via holes 133 that penetrate through thirteen layers from the dielectric layer PL04 to the dielectric layer PL13.

External RF connection terminals $TP_{RF}$, which are provided for the above-described transmission signal input terminals 111 and 121 and the reception signal output terminals 1121, 1122, 1221 and 1222, an external antenna connection terminal $TP_{ANT1}$, which is provided for the first antenna connection terminal 101, an external antenna connection terminal $TP_{ANT2}$, which is provided for the second antenna connection terminal 102, external connection ground terminals $TP_{GND}$ and external control signal input terminals $TP_{CON}$ are arranged along an outer periphery of a back surface of the dielectric layer PL15, which is the lowermost layer of the multilayer body 100.

In addition, external connection ground terminals $TP_{GND}$ are provided in the center of the back surface of the dielectric layer PL15. The external RF connection terminals $TP_{RF}$ and the external antenna connection terminals $TP_{ANT1}$ and $TP_{ANT2}$ are connected to inner layer electrodes of each layer by conductive via holes that penetrate through certain dielectric layers so as to realize the circuit illustrated in FIG. 1. The external connection ground terminals $TP_{GND}$ are connected to the inner layer ground electrode $DP_{G02}$ via a plurality of conductive via holes 133 and 134 which penetrate through the dielectric layer PL15.

These external connection terminals are respectively mounted on certain lands of a mother substrate on which the high-frequency module 10 is mounted.

In the above-described configuration, the fourth individual terminal Pi14 of the first switch element 21 and the fourth individual terminal Pi24 of the second switch element 22, which are not connected to a filter circuit or a SAW filter, are connected to the inner layer ground electrode $DP_{G01}$ by only the conductive via holes 131 and 132. Thus, the fourth individual terminals Pi14 and Pi24 are connected to ground over a short distance. Therefore, generation of a parasitic inductance by a wiring line used to connect to ground is significantly reduced or prevented and isolation is improved.

In addition, as described above, the inner layer ground electrode $DP_{G01}$ is arranged in the vicinity of electrodes of the front surface of the multilayer body 100 without there being any layers on which a filter circuit is provided therebetween, and as a result, the length of wiring lines used to connect to ground are further shortened. Thus, generation of a parasitic inductance is further reduced or prevented and isolation is improved.

In addition, in particular, in the case where a plurality of switch elements are integrated as described in this preferred embodiment, although the mounting area is reduced, the distance between switch elements and the distance between terminals is also reduced, but isolation is still reliably secured with the above described configuration. That is, space-saving is achieved while improving isolation. In addition, in the case where switch elements are integrated in this way, sharing of a control signal is possible, the number of external control signal input terminals $TP_{CON}$ is reduced, the number of routing electrodes is also reduced and the multilayer body is further reduced in size.

Figure 4:
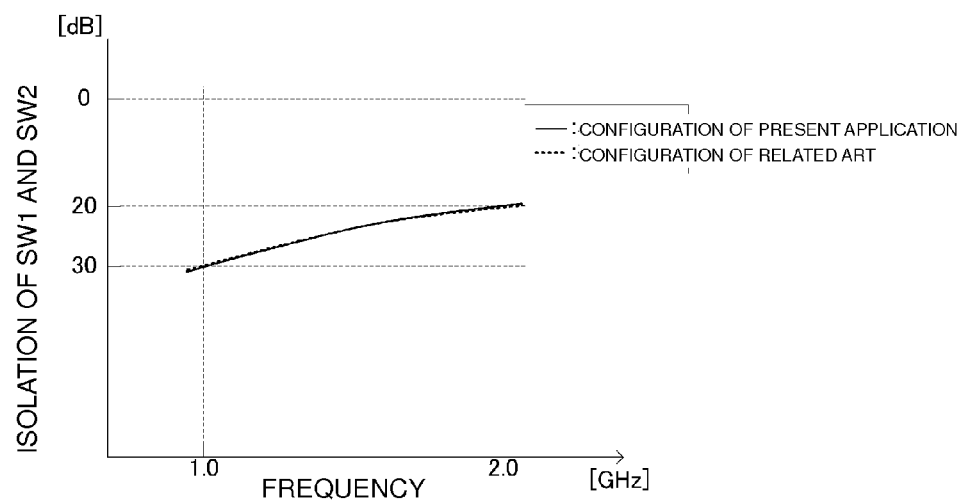
FIG. 4 illustrates isolation-frequency characteristics of switches of the high-frequency module 10 having the configuration of the first preferred embodiment of the present invention and of a high-frequency module employing terminating resistors of the related art.

FIG. 4 illustrates isolation-frequency characteristics of switches of the high-frequency module 10 having the configuration of the first preferred embodiment and of the high-frequency module including terminating resistors of the related art. As illustrated in FIG. 4, even when the configuration of this preferred embodiment is used, similarly to the configuration of the related art in which terminating resistors are used, isolation of about 20 dB or more, for example, is secured in a frequency band from 900 MHz to 2 GHz.

Figure 5:
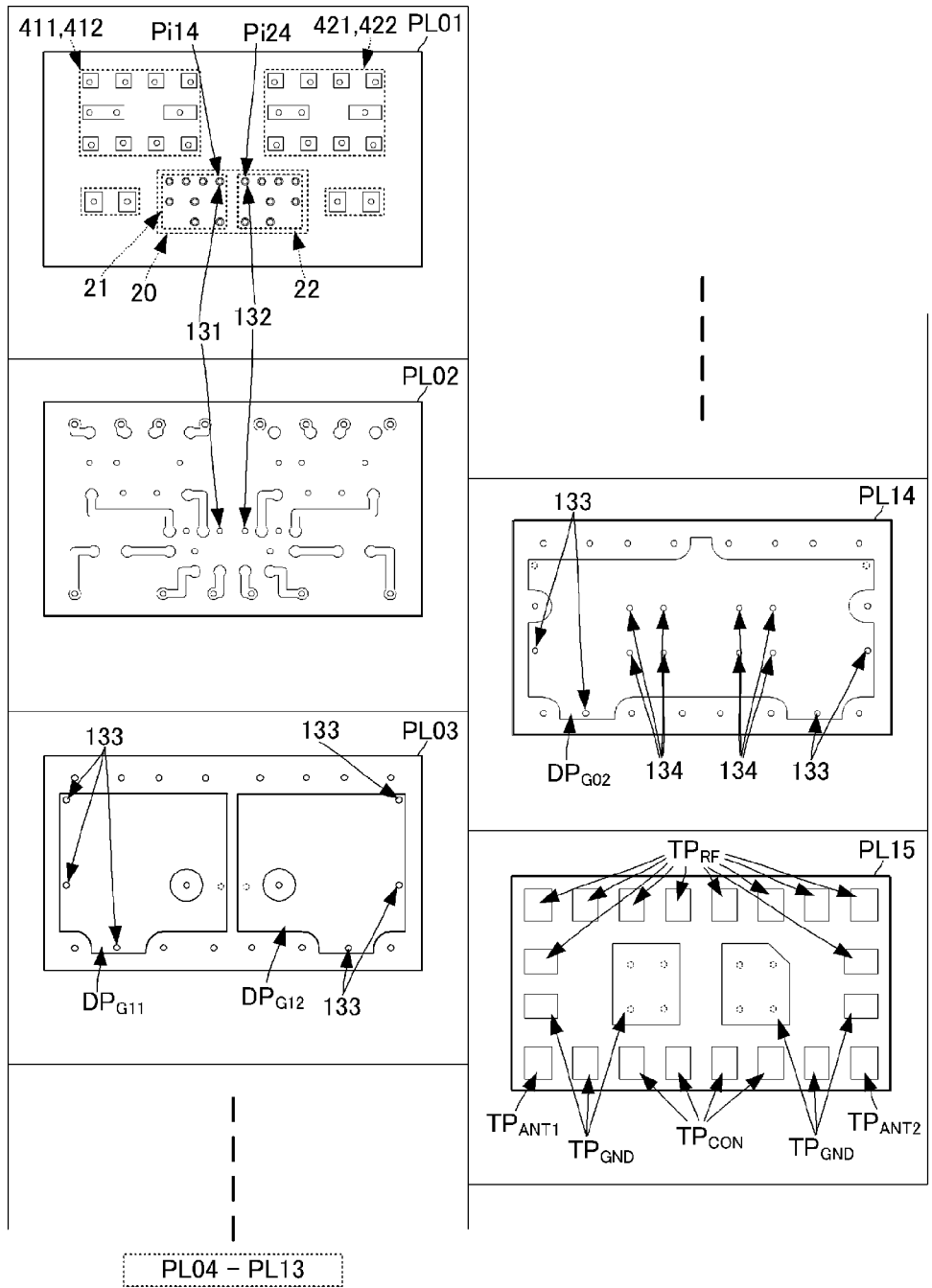
FIG. 5 is a partial layer diagram of a high-frequency module 10A according to a second preferred embodiment of the present invention.
Figure 6:
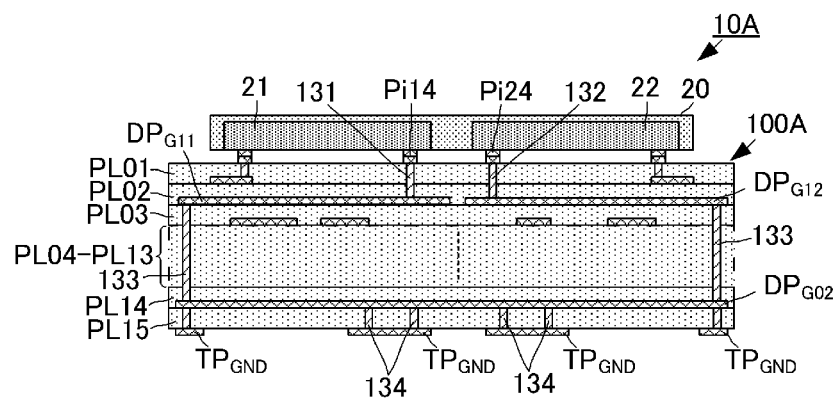
FIG. 6 is a sectional view illustrating a layered structure of the high-frequency module 10A according to the second preferred embodiment of the present invention.
Figure 7A:
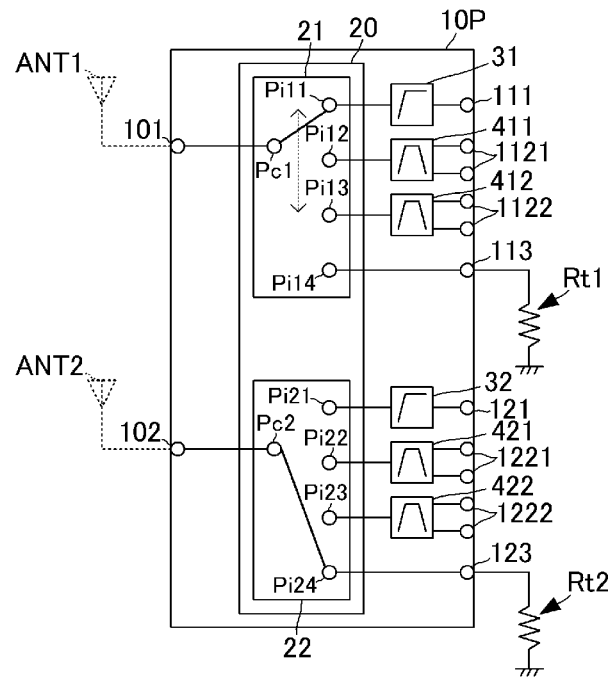
FIGS. 7A and 7B are block diagrams illustrating the configuration of a high-frequency module 10P of the related art having the same configuration as a high-frequency module of Japanese Unexamined Patent Application Publication No. 2010-212962.
Figure 7B:
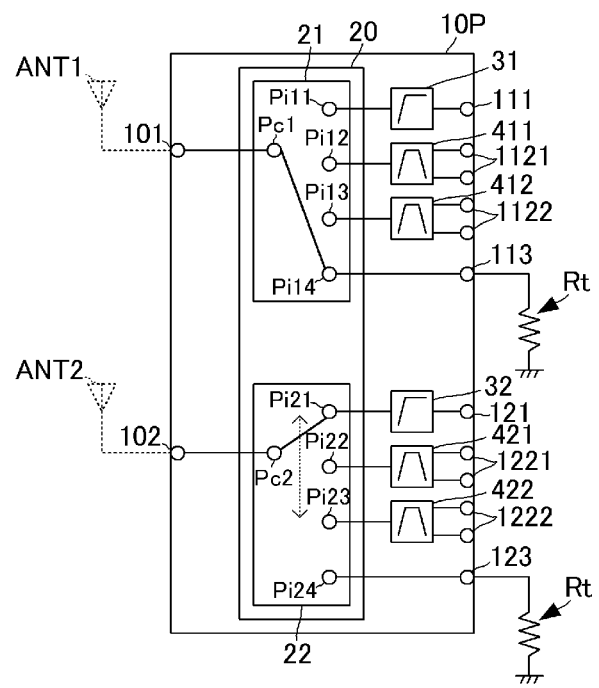

Next, a high-frequency module according to a second preferred embodiment of the present invention will be described while referring to the drawings. FIG. 5 is a partial layer diagram of a high-frequency module 10A according to the second preferred embodiment. FIG. 6 is a sectional view illustrating a layered structure of the high-frequency module 10A according to the second preferred embodiment.

The high-frequency module 10A of this preferred embodiment preferably has the same configuration as the high-frequency module 10 of the first preferred embodiment except that the shape of an inner layer ground electrode provided on the dielectric layer PL03 is different. Therefore, only this difference will be described.

Inner layer ground electrodes $DP_{G11}$ and $DP_{G12}$ are provided on the dielectric layer PL03, which is a third layer of a multilayer body 100A. The inner layer ground electrodes $DP_{G11}$ and $DP_{G12}$ are arranged with a gap therebetween and are electrically isolated from each other.

The inner layer ground electrode $DP_{G11}$ preferably has a shape that includes a mounting area of the first switch element 21 when the multilayer body 100A is viewed in plan (viewed from front surface side). The inner layer ground electrode $DP_{G11}$ is connected to the fourth individual terminal Pi14 of the first switch element 21 via the conductive via hole 131 that penetrates through the dielectric layers PL01 and PL02 in the stacking direction.

The inner layer ground electrode $DP_{G12}$ preferably has a shape that includes a mounting area of the second switch element 22 when the multilayer body 100A is viewed in plan (viewed from front surface side). The inner layer ground electrode $DP_{G12}$ is connected to the fourth individual terminal Pi24 of the second switch element 22 via the conductive via hole 132 that penetrates through the dielectric layers PL01 and PL02 in the stacking direction.

The inner layer ground electrodes $DP_{G11}$ and $DP_{G12}$ are connected to the inner layer ground electrode $DP_{G02}$ via a plurality of conductive via holes 133 that penetrate through layers ranging from the dielectric layer PL04 to the dielectric layer PL13.

With the above-described configuration, inner layer ground electrodes to which the fourth individual terminal Pi14 of the first switch element 21 and the fourth individual terminal Pi24 of the second switch element 22 are directly connected using conductive via holes and that are close to the fourth individual terminals Pi14 and Pi24 are electrically isolated from each other. Consequently, transmission of communication signals between switch elements via an inner layer ground electrode is significantly reduced or prevented. Thus, isolation of the switch elements from each other is further improved.

In addition, in this preferred embodiment, an example was described in which the inner layer ground electrodes $DP_{G11}$ and $DP_{G12}$ are provided on the same dielectric layer, but they may instead be provided on different dielectric layers. In such a case, provided that the inner layer ground electrodes $DP_{G11}$ and $DP_{G12}$ do not face each other with a dielectric layer interposed therebetween, isolation is further improved.

In addition, in each of the above-described preferred embodiments, a high-frequency module preferably including two switch elements was described, but the above-described configurations can also be applied to a high-frequency module including three or more switch elements that are connected to different antennas.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a plurality of switch elements each including an antenna connection terminal and a plurality of switching connection terminals; and
   a multilayer body on which the plurality of switch elements are mounted; wherein
   a filter component mounted on the multilayer body or a filter circuit defined by an inner layer electrode of the multilayer body is connected to any of the switching connection terminals; and
   a switching connection terminal of each of the plurality of switch elements that is not connected to the filter component or the filter circuit is directly connected to an inner layer ground electrode provided in the multilayer body; wherein
   the plurality of switch elements are mounted on a front surface of the multilayer body;
   the switching connection terminals that are not connected to the filter component or the filter circuit are connected to the inner layer ground electrode by conductive via holes; and
   the inner layer ground electrode, which is directly connected with the conductive via holes to the switching connection terminals of the plurality of switch elements that are not connected to the filter component or the filter circuit, includes portions that are electrically isolated from each other and to each of which one of the plurality of switch elements is connected.

2. The high-frequency module according to claim 1, wherein the inner layer ground electrode is located closer to a front surface side of the multilayer body than the inner layer electrode of the filter circuit.

3. The high-frequency module according to claim 1, wherein the plurality of switch elements are mounted on the multilayer body as an integrated switch module.

4. The high-frequency module according to claim 1, wherein the multilayer body includes a plurality of dielectric layers stacked on each other.

5. The high-frequency module according to claim 4, further comprising mounting lands provided on a front surface of one of the dielectric layers that defines a front surface of the multilayer body.

6. The high-frequency module according to claim 5, further comprising first and second SAW filter devices mounted on the front surface of the multilayer body.

7. The high-frequency module according to claim 4, wherein the multilayer body includes an inner layer ground electrode arranged on one of the dielectric layers along substantially an entire surface thereof.

8. The high-frequency module according to claim 4, further comprising electrode patterns that define inductors and capacitors provided on some of the dielectric layers.

9. The high-frequency module according to claim 8, wherein the inductors include line-shaped electrodes having a loop-shaped configuration and including conductive via holes that connect the line-shaped electrodes to one another in a stacking direction of the multilayer body.

10. The high-frequency module according to claim 4, wherein the portions of the inner layer ground electrode includes two inner layer ground electrodes arranged on one of the dielectric layers with a gap therebetween so as to be electrically isolated from each other.

11. The high-frequency module according to claim 10, wherein the plurality of switch elements includes a first switch element and a second switch element, and a first of the two inner layer ground electrodes includes a mounting area of the first switch element and a second of the two inner layer ground electrodes includes a mounting area of the second switch element.

* * * * *